United States Patent [19]
Ngo et al.

[11] Patent Number: 5,781,046
[45] Date of Patent: Jul. 14, 1998

[54] PUSH-AND-PULL DRIVER CIRCUIT FOR DRIVING AN H-BRIDGE COUPLED TO A TWO-TERMINAL INDUCTIVE LOAD

[75] Inventors: Tuan V. Ngo, Eden Prairie; Raymond E. Barnett, Burnsville, both of Minn.

[73] Assignee: VTC, Inc., Bloomington, Minn.

[21] Appl. No.: 408,219

[22] Filed: Mar. 22, 1995

[51] Int. Cl.$^6$ ........................................ H03K 3/00
[52] U.S. Cl. .................. 327/110; 327/487; 327/489; 327/588; 360/46; 360/68
[58] Field of Search ..................... 327/108, 110, 327/588, 374, 376, 377, 484, 487, 489, 109, 111, 112; 360/46, 67, 68; 318/293, 599

[56] References Cited

U.S. PATENT DOCUMENTS

| | | | |
|---|---|---|---|
| 3,798,471 | 3/1974 | Williams et al. | 327/108 |
| 3,988,642 | 10/1976 | Herchner | 361/86 |
| 4,305,010 | 12/1981 | Wise | 327/108 |
| 4,419,593 | 12/1983 | Butler et al. | 327/108 |
| 4,454,574 | 6/1984 | Bush et al. | 363/134 |
| 4,523,238 | 6/1985 | Keel et al. | 360/46 |
| 4,612,452 | 9/1986 | Stefani et al. | 327/377 |
| 4,633,358 | 12/1986 | Nagano | 361/31 |
| 4,700,282 | 10/1987 | Menniti et al. | 363/56 |
| 4,706,035 | 11/1987 | Dijkmans et al. | 330/156 |
| 4,791,382 | 12/1988 | Shiomi et al. | 327/108 |
| 4,816,934 | 3/1989 | Tsuyuguchi | 360/62 |
| 5,067,032 | 11/1991 | Ida | 360/46 |
| 5,257,175 | 10/1993 | Skelton et al. | 363/56 |
| 5,281,862 | 1/1994 | Ma | 327/108 |
| 5,282,094 | 1/1994 | Ngo | 360/46 |
| 5,287,231 | 2/1994 | Shier et al. | 360/68 |
| 5,291,347 | 3/1994 | Ngo et al. | 360/68 |
| 5,296,975 | 3/1994 | Contreras et al. | 360/46 |
| 5,309,347 | 5/1994 | Poma et al. | 363/63 |
| 5,397,938 | 3/1995 | Wilhelm et al. | 327/482 |

FOREIGN PATENT DOCUMENTS

| | | | |
|---|---|---|---|
| 26 37 772 A 1 | 3/1977 | Germany . | |
| 2637772 | 3/1977 | Germany | 327/110 |

OTHER PUBLICATIONS

A. Pshaenich, *Electronic Design 4*, Feb. 15, 1977, pp. 86–91.

R. Grimmer, "Data Bus Driver", *IBM Technical Disclosure Bulletin*, vol. 20, No. 5, Oct. 1977.

*Primary Examiner*—Timothy P. Callahan
*Assistant Examiner*—Kenneth B. Wells
*Attorney, Agent, or Firm*—Kinney & Lange, P.A.

[57] ABSTRACT

A write driver for a two-terminal inductive load comprises an H-bridge switching circuit and a push-pull driver circuit. The H-bridge switching circuit responds to a first mode to conduct a current in a first direction through the inductive load and responds to a second mode to conduct the current in a second direction through the inductive load. The push-pull driver circuit responds to the first mode to push a charge current into a first control node of the H-bridge and responds to the second mode to pull a discharge current from the first control node. In one form, the write driver includes a second push-pull driver circuit responsive to the first mode to pull a discharge current from a second control node and to the second mode to push a charge current into the second control node.

5 Claims, 2 Drawing Sheets

PUSH-AND-PULL DRIVER CIRCUIT FOR DRIVING AN H-BRIDGE COUPLED TO A TWO-TERMINAL INDUCTIVE LOAD

BACKGROUND OF THE INVENTION

The present invention relates to write drivers for magnetic transducers. More particularly, it pertains to a write driver circuit for a two-terminal inductive transducer having improved switching performance.

Inductive magnetic transducers are useful for writing to or reading from magnetic data-storage media. Conventionally, inductive transducers write binary-formatted data to a moving magnetic storage medium, such as a rotating magnetic disc, by imparting a bipolar magnetic pattern representing the binary data to the medium. Because current flowing in a conductor generates a magnetic field according to its direction of flow, producing the bipolar magnetic pattern entails forcing current through an inductive coil in forward and reverse directions corresponding to the binary data. Applying the resulting fields to the magnetic disc coerces a series of magnetic dipoles into alignment with the fields to form the bipolar magnetic pattern.

A write driver controls current flow through the inductive coil. Write drivers for two-terminal inductive coils usually comprise four switches operated as switching pairs to control current flow in the coil. Activating one pair directs current flow in a first direction through the coil, and activating the other pair directs current flow in a second and opposite direction. This switching arrangement is known as an H-bridge, or H-switch, because the four switches and the coil operate in an "H-like" formation. With the coil forming the bar of the "H" and the switches forming two vertical line segments, the switching pairs direct current along the diagonals of the "H", giving rise to the term diagonal pairs. Although this basic form of the H-bridge requires four control signals, i.e. one per switch, to control current flow, it is common, because of the pairing, to use only two. Additionally, such switching systems (commonly use transistors operating between conductive (activated) and nonconductive states as switches. FIG. 1 shows a prior art write driver having an H-bridge with only two control signals.

In the prior art write driver, four transistors $Q_1$, $Q_2$, $Q_3$, and $Q_4$ and inductive coil L form an H-bridge connected between voltage source $V_{CC}$ and current source $I_W$. Current source $I_W$ is coupled to voltage source $V_{EE}$, which is at ground potential. Transistors $Q_1$ and $Q_2$ form a first diagonal pair, and transistors $Q_3$ and $Q_4$ form a second. Transistors $Q_1$ and $Q_4$ have their collectors connected to voltage source $V_{CC}$ and their emitters connected to the respective collectors of transistors $Q_3$ and $Q_2$. The emitters of transistors $Q_2$ and $Q_3$ are coupled together and to current source $I_W$. Because of the high current switched by transistors $Q_1$–$Q_4$, these transistors are large devices. PNP-type transistors $Q_9$ and $Q_{10}$ form a differential pair which controls the H-bridge by switching current source $I_2$ according to the lower of inputs $W_D$ and $W_{DN}$ applied to the respective bases of transistors $Q_9$ and $Q_{10}$.

When input $W_D$ is lower than input $W_{DN}$, transistor $Q_{10}$ conducts current $I_2$ from source $I_2$, raising collector potential $V_{C10}$ of transistor $Q_{10}$ to $V_{EE}+(I_{C10}-I_{B8})R_1$, where $V_{EE}$, $I_{C1}$, and $I_{B2}$ respectively denote the voltage of source $V_{EE}$, the collector current of transistor $Q_{10}$, and the base current of transistor $Q_8$. Transistor $Q_8$ is thereby activated. Transistor $Q_8$, configured as an emitter-follower, has its base connected to the collector of transistor $Q_{10}$, its collector connected to voltage source $V_{CC}$, and its emitter corrected to the bases of transistors $Q_2$ and $Q_6$ and to voltage source $V_{EE}$ via resistor $R_4$. Thus, when transistor $Q_8$ is activated, a portion of its emitter current $I_{E8}$ flows through resistor $R_4$ and into the bases of transistors $Q_2$ and $Q_6$. That portion of the emitter current $I_{E8}$ flowing through resistor $R_4$ raises the base potentials $V_{B2}$ and $V_{B6}$ of respective transistors $Q_2$ and $Q_6$ to a voltage sufficient to activate those transistors. When activated, transistor $Q_6$ draws collector current $I_{C6}$ through resistor $R_2$, which is connected between a collector of transistor $Q_6$ and voltage source $V_{CC}$. Collector current $I_{C6}$ generates a voltage across resistor $R_2$ that deactivates transistor $Q_4$.

When input $W_{DN}$ is higher than input $W_D$, transistor $Q_9$, connected between current source $I_2$ and resistor $R_5$, does not conduct. Because resistor $R_5$ is coupled to voltage source $V_{EE}$ and transistor $Q_9$ is nonconductive, collector potential $V_{C9}$ of transistor $Q_9$ decreases to $V_{EE}$. Transistor $Q_7$ has its base connected to the collector of transistor $Q_9$, its collector connected to source $V_{CC}$, and its emitter connected to the bases of transistors $Q_3$ and $Q_5$ and to source $V_{EE}$ through resistor $R_3$. Thus, when transistor $Q_9$ is nonconductive, base potentials $V_{B7}$, $V_{B5}$, and $V_{B3}$ of respective transistors $Q_7$, $Q_5$, and $Q_3$ fall to $V_{EE}$, thereby deactivating transistors $Q_7$, $Q_5$, and $Q_3$. Transistor $Q_5$ has its emitter connected to the emitter of transistor $Q_6$ and to the positive terminal of current source $I_1$, and its collector connected to the base of transistor $Q_1$ and to source $V_{CC}$ via resistor $R_1$. Hence, when transistor $Q_5$ is deactivated, resistor $R_1$ conducts no collector current $I_{C5}$. As a consequence, base potential $V_{B1}$ of transistor $Q_1$ rises to $V_{CC}$, activating transistor $Q_1$. Accordingly, the first diagonal pair conducts current $I_W$, causing coil L to generate a magnetic field having a first polarity.

Reversing polarity of the field entails deactivating the first diagonal pair (transistors $Q_1$ and $Q_2$) and activating the second diagonal pair by switching inputs $W_{DN}$ and $W_D$ from high to low and low to high, respectively. Operating input $W_{DN}$ low activates transistors $Q_9$, $Q_7$, $Q_5$, and $Q_3$, and deactivates transistor $Q_1$, and operating input $W_D$ high deactivates transistors $Q_{10}$, $Q_8$, $Q_6$, and $Q_2$ and activates transistor $Q_4$. Thus, the second diagonal pair, consisting of transistors $Q_3$ and $Q_4$, conducts current $I_W$ in a second direction through coil L, thereby generating a field having a second polarity, opposite the first. Therefore, selectively switching inputs $W_D$ and $W_{DN}$ alternately directs current $I_W$ through the coil to write a specific bipolar magnetic pattern on a magnetic medium.

Although the prior art driver of FIG. 1 ideally functions as described, it operates under practical switching limitations inherent to bipolar junction transistors. Unlike ideal switches, bipolar junction transistors have parasitic base-to-collector (BTC) capacitances that preclude instantaneous changes between conductive (activated) and nonconductive states. Because they are slow to charge and discharge, BTC capacitances appreciably prolong, or delay, transitions between these states, thereby inhibiting rapid switching of the H-bridge. In particular, because transistor pairs $Q_2$–$Q_6$ and $Q_3$–$Q_5$ are larger devices, they have larger BTC capacitances than the other transistors of the prior art driver. Thus, they more seriously impact the switching efficiency of the write driver. The time they require for charging and discharging limits the write frequency of the transducer and the storage density of the medium. The limitation becomes especially acute during a magnetic field reversal when the charging and discharging times are cumulative.

Reversing the magnetic field entails switching both diagonal pairs. One pair switches from nonconducting to conducting and the other from conducting to nonconducting. In FIG. 1, the BTC capacitances of transistor pairs $Q_2$–$Q_6$ and $Q_3$–$Q_5$ charge and discharge by the respective base currents $I_{B2-6}$ and $I_{B3-5}$. Transistors $Q_8$ and $Q_7$ supply these base currents by their respective emitters. Although transistors $Q_8$ and $Q_7$ are good sources of current, much of the current they supply sinks through resistors $R_4$ and $R_3$, respectively. That which supplies the bases of transistor pairs $Q_2$–$Q_6$ and ($Q_3$–$Q_5$ is not sufficient to avoid stewing the output of the transducer.

Discharging the BTC capacitances of transistor pairs $Q_2$–$Q_6$ and $Q_3$–$Q_5$ occurs passively by sinking base currents $I_{B2-6}$ and $I_{B3-5}$ through respective resistors $R_4$ and $R_3$ to source $V_{EE}$. Currents sinking through resistors $R_4$ and $R_3$ produce I-R voltages that support the base potentials of respective transistor pairs $Q_2$–$Q_6$ and $Q_3$–$Q_5$. Supporting these base potentials prolongs the conductive states of the transistor pairs during discharge, thereby preventing current $I_W$ from switching when desired. Moreover, a portion of the discharge as well as inductive kickback enters the bases of the switching transistors, causing momentary conductive surges in the switching transistors. These momentary surges cause glitching in the output of the transducer. Thus, passive discharging introduces further slewing and causes glitching in the output of the transducer Although reducing resistors $R_3$ and $R_4$ would speed the rate of discharge, it would also increase the power needs of the driver without solving the glitching problem. In sum, limitations in sourcing and sinking the base currents of transistor pairs $Q_2$–$Q_6$ and $Q_3$–$Q_5$ cause appreciable slewing and glitching, generally degrading the quality of data written to a medium, increasing the time required to write data, and restricting the storage density of the medium.

SUMMARY OF THE INVENTION

A write driver for a two-terminal inductive load comprises a transistor H-bridge switching circuit and a push-pull driver circuit. The H-bridge switching circuit responds to a first mode to conduct a current in a first direction through the inductive load and responds to a second mode to conduct the current in a second direction through the inductive load. The push-pull driver circuit responds to the first mode to push a charge current into a first control node of the H-bridge and responds to the second mode to pull at discharge current from the first control node.

In one form of the invention, the write driver includes a second push-pull driver circuit responsive to the first mode to pull a discharge current from a second control node of the H-bridge and to the second mode to push a charge current into the second control node. By providing the charge and discharge currents to the respective first and second control nodes, the push-pull driver charges and discharges parasitic capacitance associated with these nodes.

Another aspect of the present invention is a method of charging and discharging parasitic BTC capacitances of first and second differentially-paired transistors. A charge current is actively pushed into the base of the first transistor while a discharge current is actively pulled from the base of the second transistor. Preferably, a charge current is also actively pushed into the base of the second transistor while a discharge current is actively pulled from the base of the first transistor.

DETAILED DESCRIPTION OF THE PREFERRED EMBODIMENTS

Figure 1:
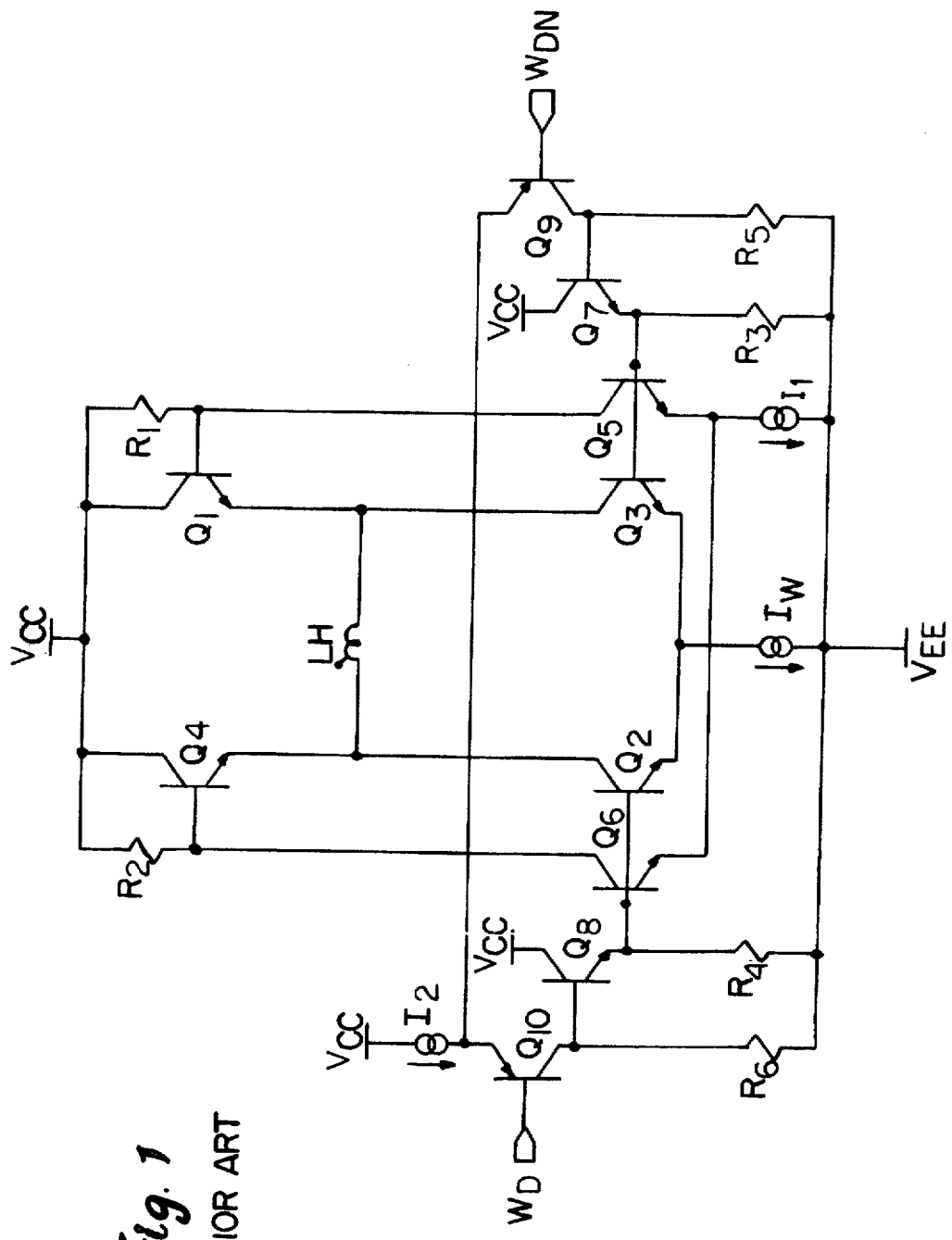
FIG. 1 is a schematic diagram of a prior art write driver circuit.
Figure 2:
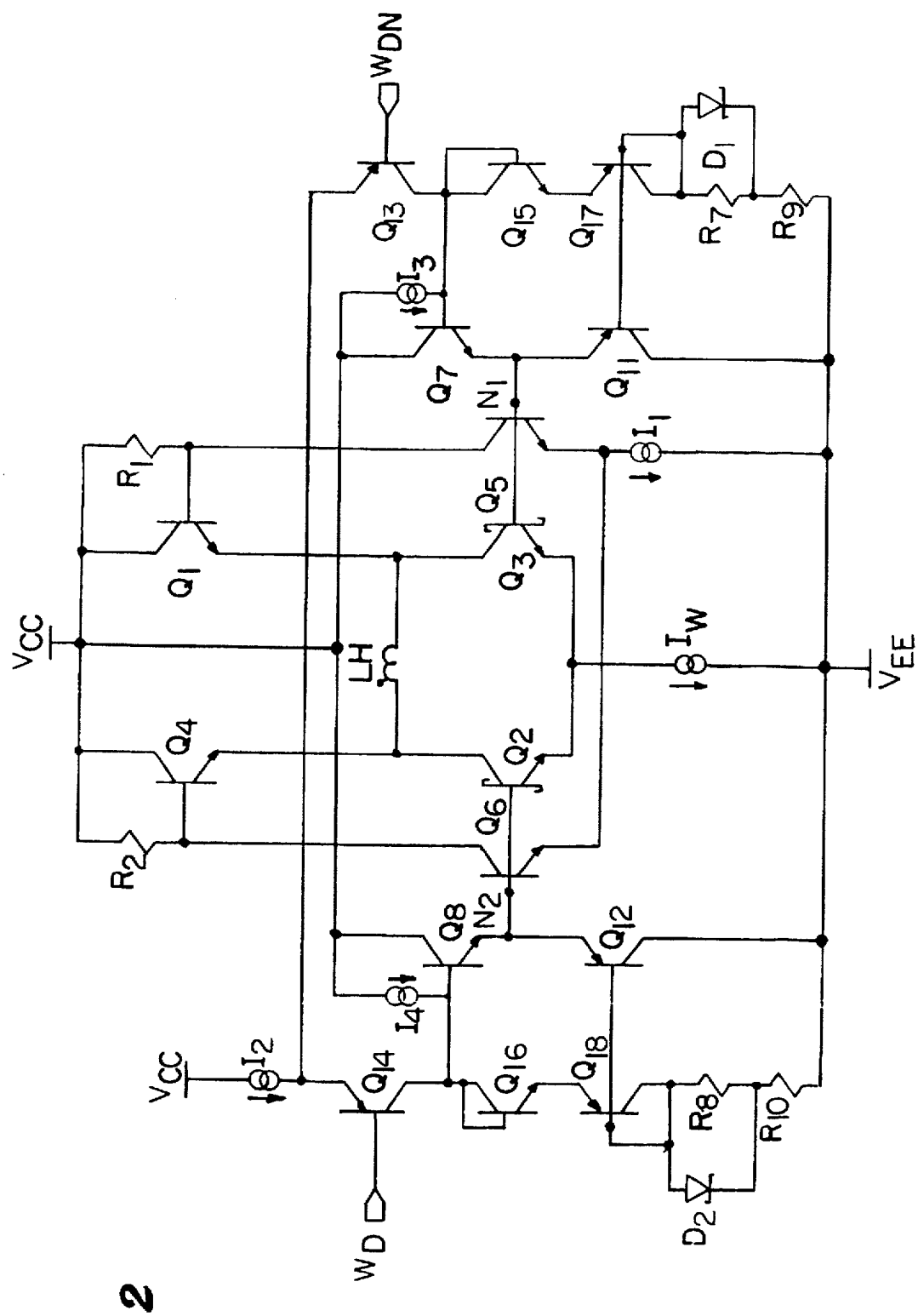
FIG. 2 is a schematic diagram of a writ(, driver circuit according to the present invention.

FIG. 2 shows a write driver for a two-terminal inductive load, according to the present invention. Four transistors $Q_1$, $Q_2$, $Q_3$, and $Q_4$ and inductive coil L form an H-bridge connected between voltage source $V_{CC}$ and current source $I_W$ coupled to voltage source $V_{EE}$. Transistors $Q_1$ and $Q_2$ form a first diagonal pair, and transistors $Q_3$ and $Q_4$ form a second. Transistors $Q_1$ and $Q_4$ have collectors connected to voltage source $V_{CC}$ and emitters connected to the respective collectors of transistors $Q_3$ and $Q_2$. The emitters of transistors $Q_2$ and $Q_3$ are coupled together and to current source $I_W$. Because of the large current conducted by transistors $Q_1$–$Q_4$, these transistors are large devices with significant BTC capacitances. Transistors $Q_2$ and $Q_3$ are Schottky transistors, which by design are unsaturable. Transistors $Q_5$ and $Q_6$ form a first emitter-coupled differential pair which switches current source $I_W$ to one or the other side of the differential pair according to which transistor $Q_5$ or $Q_6$ has the higher base voltage. The respective bases of transistors $Q_5$ and $Q_6$ are coupled to the bases of transistors $Q_3$ and $Q_2$, forming two control nodes $N_1$ and $N_2$ of the H-bridge. The collectors of transistors $Q_5$ and $Q_6$ are connected to the bases of transistors $Q_1$ and $Q_4$ and to source $V_{CC}$ via resistors $R_1$ and $R_2$.

Transistors $Q_7$ and $Q_8$, configured as emitter-followers, are respectively coupled between source $V_{CC}$ and the bases of transistors $Q_5$ and $Q_6$ Transistors $Q_{11}$, and $Q_{12}$ are PNP transistors coupled between the respective emitters of transistors $Q_7$ and $Q_8$ and voltage source $V_{EE}$. The base of transistor $Q_7$ is coupled to current source $I_3$ and to the collector of PNP transistor $Q_{13}$, and the base of transistor $Q_8$ is coupled to current source $I_4$ and to the collector of PNP transistor $Q_{14}$. Transistors $Q_{13}$ and $Q_{14}$, forming a second emitter-coupled differential pair, control current source $I_2$ according to which has the lower base voltage. In other words, current source $I_2$ follows the lower of inputs $W_D$ or $W_{DN}$. Configured as diodes, transistors $Q_{15}$ and $Q_{16}$ are coupled respectively between transistors $Q_{13}$ and $Q_{17}$ and transistors $Q_{14}$ and $Q_{18}$. PNP transistors $Q_{17}$ and $Q_{18}$, also configured as diodes, are coupled via their collectors to respective diodes $D_1$ and $D_2$ and via their bases to respective transistors $Q_{11}$ and $Q_{12}$. Diodes $D_1$ and $D_2$ are parallel-coupled to respective resistors $R_7$ and $R_8$, which are connected to source $V_{EE}$ through respective resistors 1% and $R_{10}$. Because diodes $D_1$ and $D_2$ are Schottky diodes, i.e. majority-carrier devices without diffusion capacitances, they switch on and off very quickly.

Transistors $Q_8$, $Q_{12}$ and $Q_7$, $Q_{11}$ form respective first and second push-pull (also termed class-B or complementary) driver stages of the write driver. Current source $I_4$ continuously supplies a bias current $I_4$ to diode-configured transistors $Q_{16}$ and $Q_{18}$ thereby maintaining a constant forward-biasing voltage across the base-emitter junctions of transistors $Q_8$ and $Q_{12}$. Accordingly, transistors $Q_8$, $Q_{12}$, $Q_{16}$, $Q_{18}$ form a translinear loop defined by $$V_{BE8} + V_{BE12} = V_{BE16} + V_{BE18},$$

where $V_{BE}$ denotes the base-emitter voltage of the respective transistor. The biasing provided by transistors $Q_{16}$ and $Q_{18}$ and current source $I_4$ alleviate cross-over distortion inherent to switching between the positive and negative sides of the first class-B driver. Taken together, the class-B driver and the biasing circuitry constitute a class-AB driver, because both transistors $Q_8$ and $Q_{12}$ remain active throughout operation of the write driver. Base voltage $V_{B18}$ of transistor $Q_{18}$ serves as the input to the class-AB driver. Thus, when base voltage $V_{B18}$ becomes more positive than its bias, or quiescent, value fixed by resistors $R_8$ and $R_{10}$ and bias current $I_4$, base-emitter voltage $V_{BE12}$ decreases and base-emitter voltage $V_{BE8}$ increases to maintain equality with the sum $V_{BE16}+V_{BE18}$. Transistor $Q_8$ therefore conducts, or pushes, a load current into control node $N_2$. When base voltage $V_{B18}$ becomes negative, base-emitter voltage $V_{BE10}$ increases and base-emitter voltage $V_{BE8}$ decreases an equal amount so that transistor $Q_{10}$ conducts, or pulls, a load current from control node $N_1$.

Likewise, current source $I_3$ supplies a continuous bias current $I_3$ to diode-configured transistors $Q_{15}$ and $Q_{17}$ to maintain a constant forward-biasing voltage across the base-emitter junctions of transistors $Q_7$ and $Q_{11}$. Consequently, $$V_{BE7}+V_{BE11}=V_{BE15}+V_{BE17},$$

where $V_{BE}$ denotes the base-emitter voltages of the respective transistors. The biasing provided by transistors $Q_{15}$ and $Q_{17}$ and current source $I_{13}$ alleviates cross-over distortion inherent to switching between the positive and negative sides of the second class-B driver comprising transistors $Q_7$, $Q_{11}$. Taken together, the second class-B driver and its biasing circuitry constitute a second class-AB driver. Base voltage $V_{B17}$ of transistor $Q_{17}$ serves as the input to the second class-AB driver. The second class-AB driver operates identically to the first. Moreover, to facilitate symmetrical operation, transistors $Q_7$, $Q_{15}$ and $Q_8$, $Q_{16}$ form matched NPN pairs, and transistors $Q_{11}$, $Q_{17}$ and $Q_{12}$, $Q_{18}$ form matched PNP pairs. Bias currents $I_3$ and $I_4$ and resistors $R_7$ and $R_8$ yield voltages which are less than the turn-on thresholds of diodes $D_1$ and $D_2$.

Operatively, when input $W_D$ is lower than input $W_{DN}$, transistors $Q_{14}$, $Q_{16}$, and $Q_{18}$, and resistors $R_8$ and $R_{10}$ conduct current $I_2$ from current source $I_2$. Current $I_2$ and resistor $R_8$ generate a voltage exceeding the threshold voltage of diode $D_2$ (approximately 600 millivolts), thereby activating diode $D_2$. Base voltage $V_{B18}$ of transistor $Q_{18}$ thus rises to $V_{EF}+(I_2)R_{10}+V_{D2}$, where $V_{EE}$ and $V_{D2}$ respectively denote a voltage level of source $V_{EE}$ and a voltage across diode $D_2$. When diode $D_2$ activates, its voltage $V_{D2}$ reduces the base-emitter voltage $V_{BE12}$, increasing base-emitter voltage $V_{BE8}$ and forcing transistor $Q_8$ to conduct a load current into control node $N_2$. The load current quickly charges the BTC capacitances of transistors $Q_2$ and $Q_6$ and drives them to full conductivity. In turn, transistor $Q_6$ draws collector current $I_{C6}$ (approximately equal to current $I_1$) through resistor $R_2$ connected between a collector of transistor $Q_6$ and voltage source $V_{CC}$. Collector current $I_{C6}$ generates a voltage across resistor $R_2$ that deactivates transistor $Q_4$.

Because input $W_{DN}$ is higher than input $V_D$, transistor $Q_{13}$ cannot conduct current $I_2$. Transistors $Q_7$, $Q_1$, $Q_{15}$, and $Q_{17}$ are conducting bias current $I_3$. Diode $D_1$ is inactive; so the base voltage of transistor $Q_{11}$ is $V_{EE}+I_3(R_7+R_9)$. Base-emitter voltage $V_{BE11}$ therefore remains unchanged and transistor $Q_{11}$ pulls a load current from control node $N_1$. This load current quickly deactivates transistors $Q_3$ and $Q_5$ by discharging their BTC capacitances. Transistor $Q_5$ conducts no current through resistor $R_1$. Thus, base voltage $V_{B1}$ of transistor $Q_1$ rises to $V_{CC}$, thereby activating transistor $Q_1$. Accordingly, the first diagonal pair (transistors $Q_1$ and $Q_2$) conducts current $I_W$ (right to left) through coil L, causing it to generate a magnetic field having a first polarity.

Reversing polarity of the field entails deactivating the first diagonal pair and activating the second diagonal pair by switching inputs $W_{DN}$ and $W_D$. Operating input $W_{DN}$ low activates diode $D_1$ which causes transistor $Q_7$ to push a load current into control node $N_1$. Pushing the load current into control node $N_1$ quickly charges the BTC capacitances of transistors $Q_3$ and $Q_5$ and deactivates transistor $Q_1$. On the other hand, operating input $W_D$ high deactivates diode $D_2$ which causes transistor $Q_{12}$ to pull a load current from node $N_2$, thereby rapidly discharging the BTC capacitances of transistors $Q_2$ and $Q_6$ and activating transistor $Q_4$. Thus, the second diagonal pair consisting of transistors $Q_3$ and $Q_4$ conducts write current $I_W$ in a second direction (left to right) through coil L. This current generates a field having a second polarity, opposite the first. Hence, switching inputs $W_D$ and $W_{DN}$ alternates the direction of current $I_W$ through the coil to write a specific bipolar magnetic pattern on a magnetic medium.

The present invention overcomes the switching limitations of the prior write drivers. More particularly, during a first mode, the first class-AB driver actively pushes a charge current into control nod $N_1$ of the H-bridge, and the second class-AB driver pulls a discharge current from control node $N_2$, thereby rapidly charging the BTC capacitances of transistor pair $Q_2$-$Q_6$ and discharging the BTC capacitances of transistor pair $Q_3$-$Q_5$. In a second mode, the second class-AB driver pushes a charge current into control node $N_2$, and the first class-AB driver pulls a discharge current from control node $N_1$. The present invention further promotes rapid switching by replacing resistors $R_3$ and $R_4$ of the prior art with respective transistors $Q_{11}$ and $Q_{12}$. This substitution reduces the impedance seen by nodes $N_1$ and $N_2$ during discharge and precludes the discharge currents from supporting the base potentials of transistors $Q_2$-$Q_6$ and $Q_3$-$Q_5$ during deactivation, thereby further improving switching performance. It also prevents inductive kickback from entering the bases of the switching transistors and causing glitching in the transducer output. In sum, a first mode urges rapid switching of the H-bridge by activating the first class-AB driver to source current to the first control node and the second class-AB driver to sink a current from the second control node of the H-bridge. A second mode urges rapid switching by enabling the second class-AB driver to source current to the second control node and enabling the first class-AB driver to sink a current from the first control node.

Although the present invention has been described with reference to preferred embodiments, workers skilled in the art will recognize that changes may be made in form and detail without departing from the spirit and scope of the invention.

What is claimed is:

1. A write driver switching system for supplying current to a two-terminal inductive load, comprising:

a switching circuit having first and second switching transistors each connected between a first supply terminal and respective first and second load terminals, the first and second load terminals for connecting to the inductive load, the first and second switching transistors being responsive to write signals at respective first and second control nodes for driving current in first and second directions through the inductive load;

a driver circuit having a first drive transistor coupled between the first control node and the first supply terminal and a second drive transistor coupled between the first control node and a second supply terminal;

a bias circuit for maintaining the second drive transistor in a conductive state during operation of the switching circuit, the bias circuit coupled to a control terminal of the second drive transistor and the first and second supply terminals and, the bias circuit including:

first and second diodes connected in series between respective control terminals of the first and second drive transistors; and a bias current source connected between the first diode and the second supply terminal;

control means responsive to write signals for alternately operating the first and second drive transistors to selectively charge and discharge a capacitance of the first switching transistor; and a third diode parallel-coupled to a resistor, the resistor connected between the second diode and the first supply terminal.

2. The write driver of claim 1 further comprising:

a second driver circuit having a first transistor coupled between the second control node and the first supply terminal and a second transistor coupled between the second control node and the second supply terminal.

3. The write driver switching system of claim 1 wherein the third diode is a Schottky diode.

4. In a switching circuit having a pair of load terminals for connecting to a magnetic transducer, a switching transistor connected between one of the load terminals and a first supply terminal, and a driver circuit comprising:

a first transistor having a pair of controlled terminals connected between a control terminal of the switching transistor and the first supply terminal for actively discharging a capacitance of the switching transistor to the first supply terminal;

a second transistor having a pair of controlled terminals connected between the control terminal of the switching transistor and a second supply terminal for actively charging the capacitance of the switching transistor, one of the pair of controlled terminals of the first transistor being connected to one of the pair of controlled terminals of the second transistor;

constant bias means for maintaining the first and second transistors in a conductive state during operation of the switching circuit, the constant bias means including:

first and second diodes connected in series between respective control terminals of the first and second transistors; and a bias current source connected between the second supply terminal and the first diode; and input means responsive to write signals for increasing conductivity of one of the first and second transistors the input means including a third diode parallel-coupled to a resistor the resistor connected between the second diode and the first supply terminal.

5. The driver circuit of claim 4 wherein the third diode is a Schottky diode.

* * * * *

UNITED STATES PATENT AND TRADEMARK OFFICE
CERTIFICATE OF CORRECTION

PATENT NO. : 5,781,046
DATED : JULY 14, 1998
INVENTOR(S) : TUAN V. NGO ET AL.

It is certified that error appears in the above-identified patent and that said Letters Patent is hereby corrected as shown below:

Col. 1, line 28, delete ":"

Col. 1, line 67, delete "corrected", insert --connected--

Col. 3, line 8, delete "("

Col. 3, line 8, delete "stewing", insert --slewing--

Col. 3, line 24, after "transducer", insert --.--

Col. 3, line 66, delete "writ(,", insert --write--

Col. 4, line 18, delete "$I_w$", insert --$I_1$--

Col. 5, line 19, delete "$I_{13}$", insert --$I_3$--.

Col. 5, line 31, after "$D_1$", insert --space--

Col. 5, line 50, delete "$V_D$", insert --$W_D$--

Col. 5, line 51, delete "$Q_1$", insert --$Q_{11}$--

UNITED STATES PATENT AND TRADEMARK OFFICE
CERTIFICATE OF CORRECTION

PATENT NO. : 5,781,046
DATED : July 14, 1998
INVENTOR(S) : Tuan V. Ngo et al.

It is certified that error appears in the above-identified patent and that said Letters Patent is hereby corrected as shown below:

Col. 6, line 16, delete "nod", insert --node--

Col. 8, line 18, after "transistors", insert --,--

Col. 8, line 20, after "coupled to a resistor", insert --,--

Signed and Sealed this

Twenty-seventh Day of July, 1999

Attest:

Q. TODD DICKINSON

*Attesting Officer*    *Acting Commissioner of Patents and Trademarks*